United States Patent
Satou

(10) Patent No.: US 8,080,844 B2
(45) Date of Patent: Dec. 20, 2011

(54) SEMICONDUCTOR DEVICE

(75) Inventor: Masaharu Satou, Yamagata (JP)

(73) Assignee: Renesas Electronics Corporation, Kanagawa (JP)

( * ) Notice: Subject to any disclaimer, the term of this patent is extended or adjusted under 35 U.S.C. 154(b) by 75 days.

(21) Appl. No.: 12/639,610

(22) Filed: Dec. 16, 2009

(65) Prior Publication Data

US 2010/0148242 A1    Jun. 17, 2010

(30) Foreign Application Priority Data

Dec. 16, 2008 (JP) ................................. 2008-319701

(51) Int. Cl.
*H01L 29/792* (2006.01)
(52) U.S. Cl. .............. 257/326; 257/324; 257/E29.309
(58) Field of Classification Search ............... None
See application file for complete search history.

(56) References Cited

U.S. PATENT DOCUMENTS

| 5,408,115 A | * | 4/1995 | Chang | ............................ | 257/324 |
| 5,969,383 A | * | 10/1999 | Chang et al. | ................... | 257/316 |

FOREIGN PATENT DOCUMENTS

JP    2004-247521    9/2004

* cited by examiner

*Primary Examiner* — Ha Tran T Nguyen
*Assistant Examiner* — Valerie N Brown
(74) *Attorney, Agent, or Firm* — Young & Thompson

(57) ABSTRACT

A semiconductor device suppresses short-circuit failure between a selection gate electrode and a control gate electrode while shortening the distance between the upper portions of the selection gate electrode and the control gate electrode. The device includes an impurity region formed on both sides of a channel region of a semiconductor substrate; a selection gate electrode on the channel region via a gate insulating film; a control gate electrode in the shape of sidewall via a gate isolation insulating film on both side surfaces of the selection gate electrode and on the surface of the channel region; a protective insulating film covering the sidewall of the control gate electrode; and a silicide layer on the selection gate electrode. The protective insulating film is a two-layer structure of a silicon nitride film covering the sidewall of the control gate electrode and a silicon oxide film covering the silicon nitride film.

9 Claims, 8 Drawing Sheets

(FIRST EXEMPLARY EMBODIMENT)

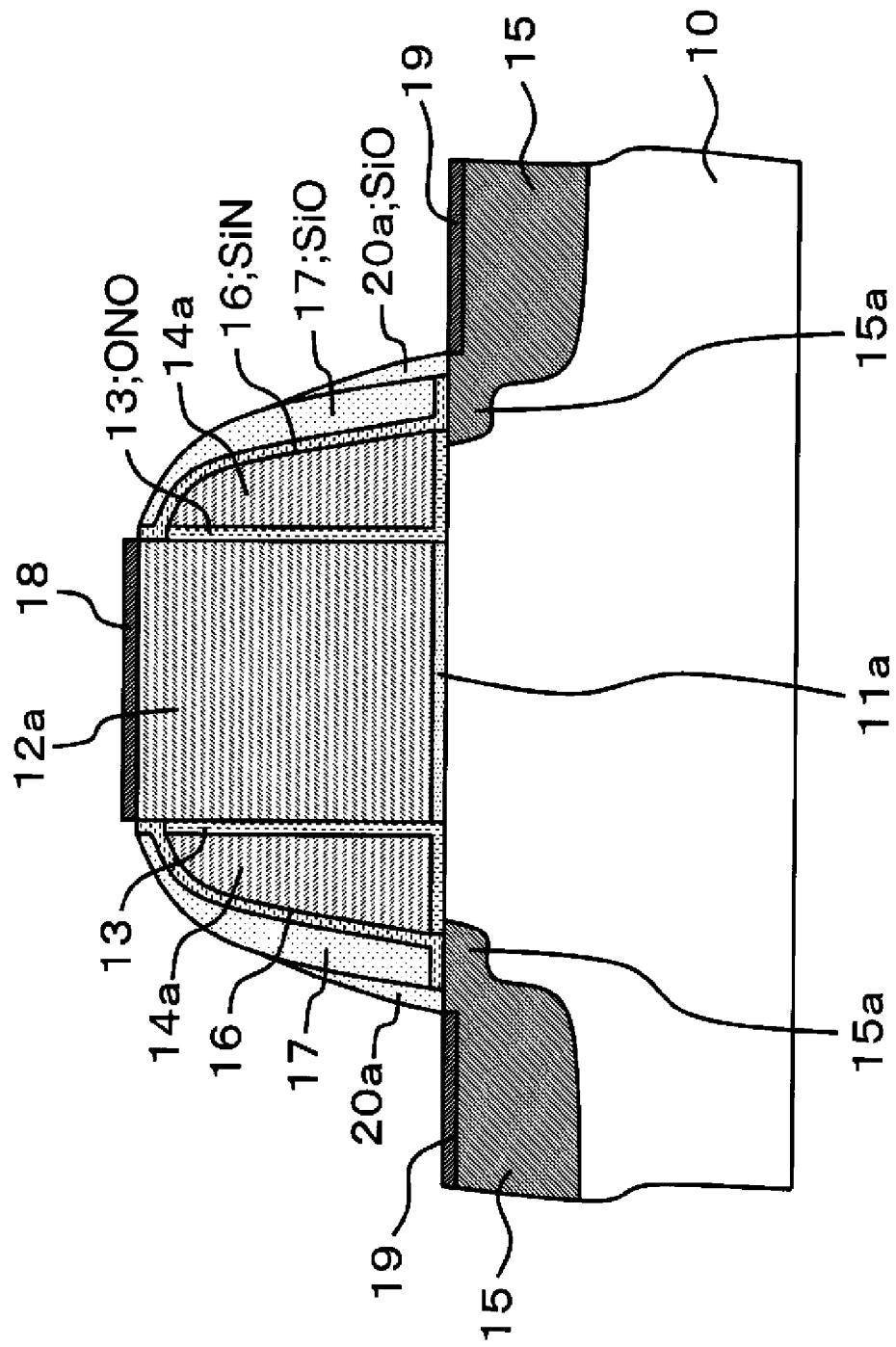

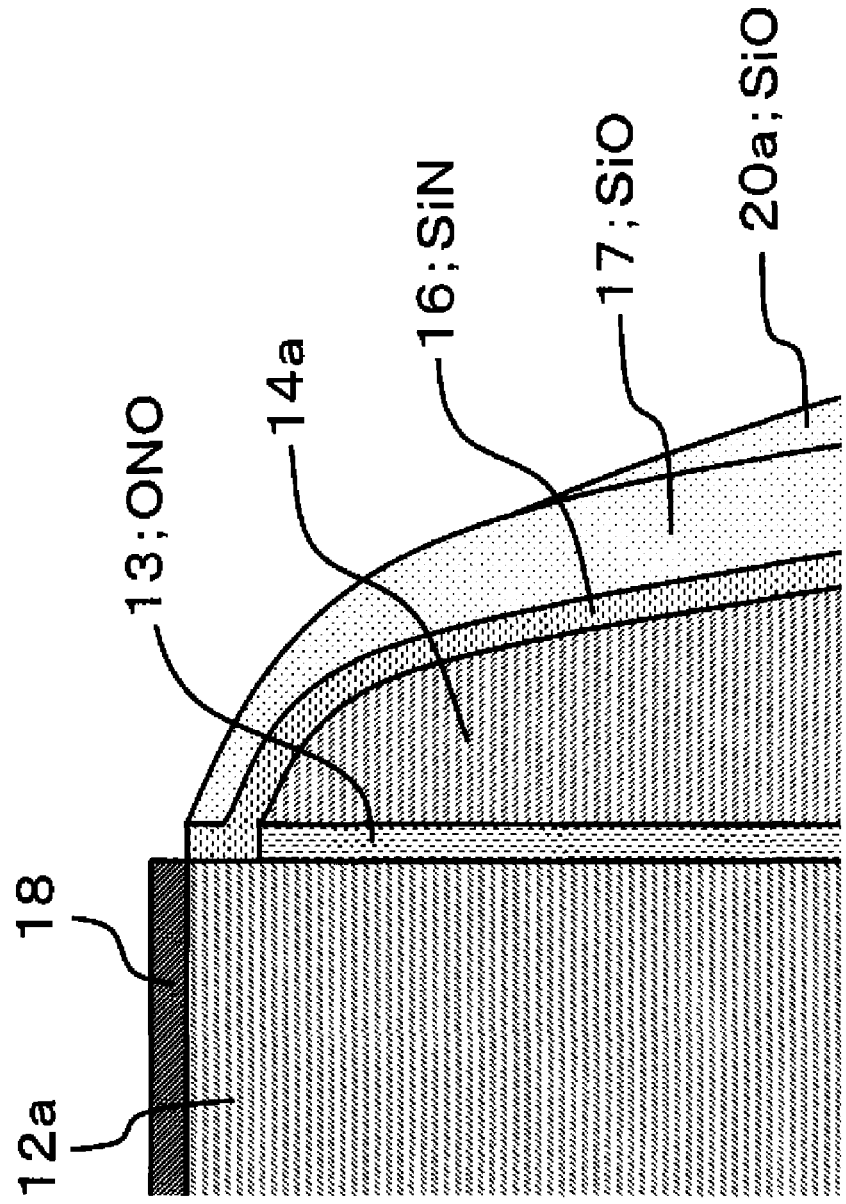

FIG. 3A (FIRST EXEMPLARY EMBODIMENT)
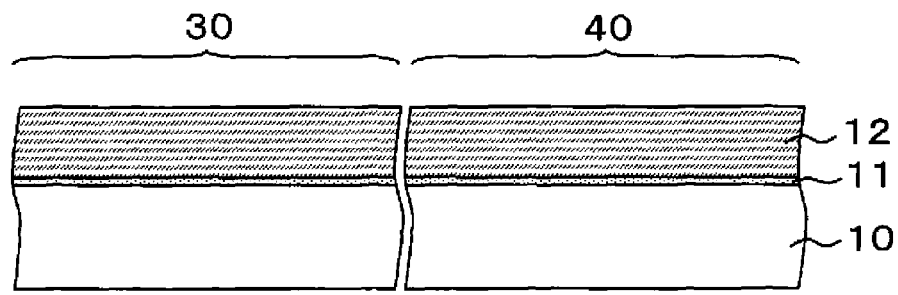
FIG. 3B (FIRST EXEMPLARY EMBODIMENT)
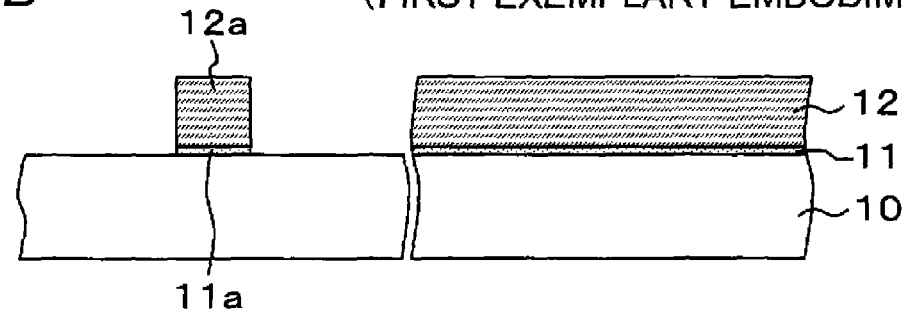
FIG. 3C (FIRST EXEMPLARY EMBODIMENT)
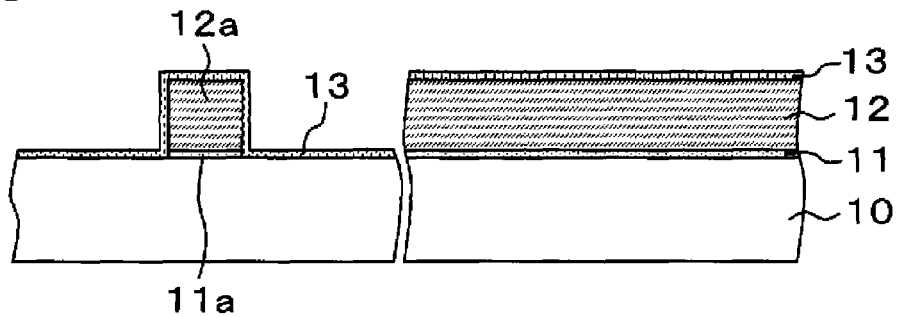
FIG. 3D (FIRST EXEMPLARY EMBODIMENT)
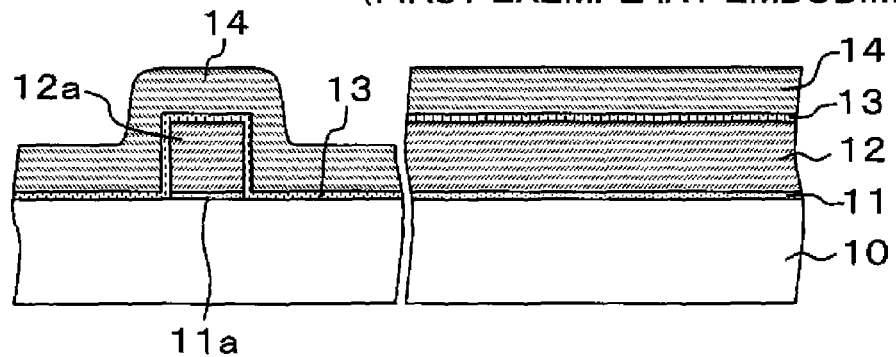

FIG. 4A  (FIRST EXEMPLARY EMBODIMENT)
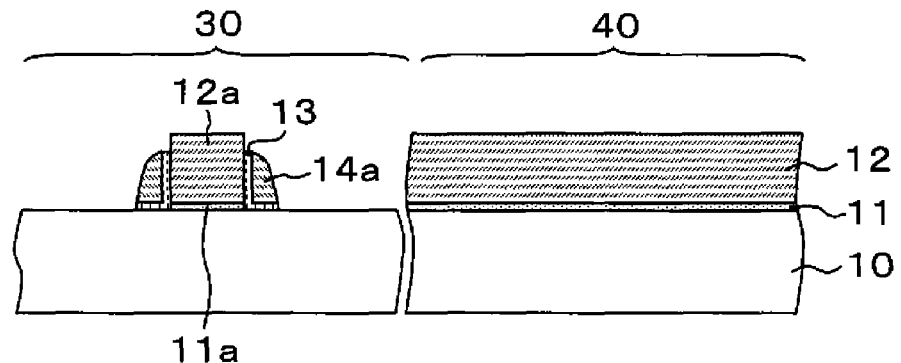
FIG. 4B  (FIRST EXEMPLARY EMBODIMENT)
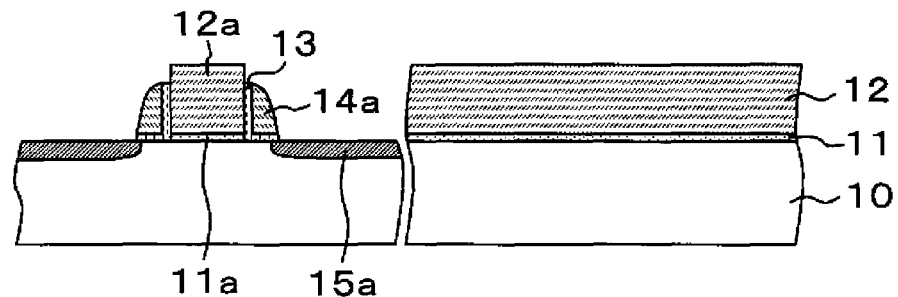
FIG. 4C  (FIRST EXEMPLARY EMBODIMENT)
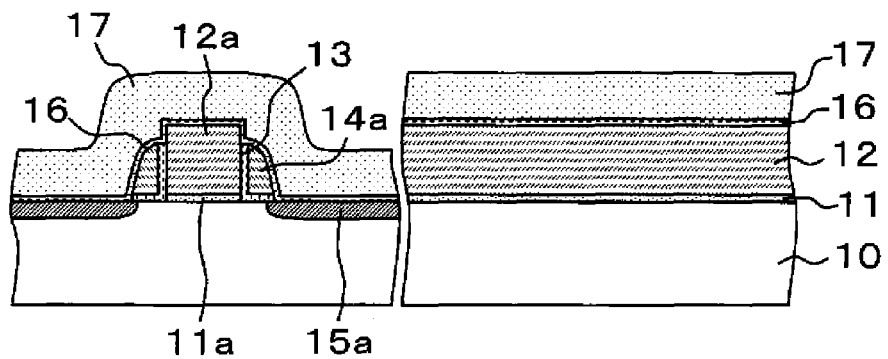

FIG. 5A (FIRST EXEMPLARY EMBODIMENT)
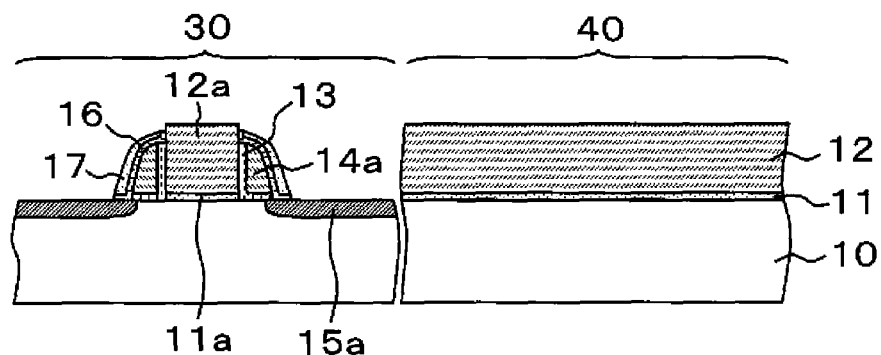
FIG. 5B (FIRST EXEMPLARY EMBODIMENT)
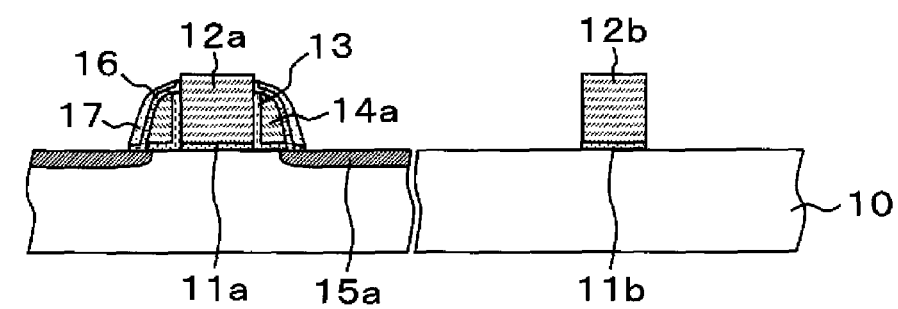
FIG. 5C (FIRST EXEMPLARY EMBODIMENT)
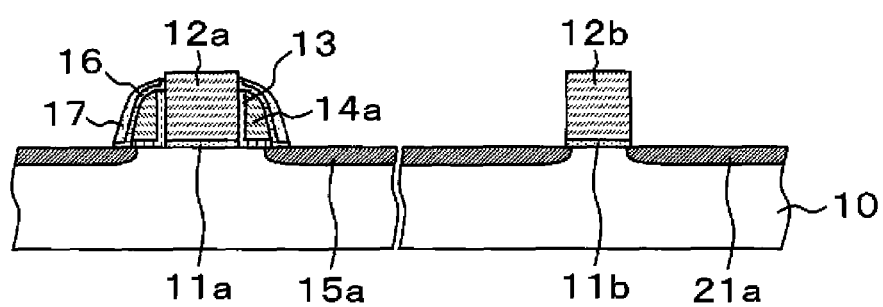

FIG. 6A  (FIRST EXEMPLARY EMBODIMENT)
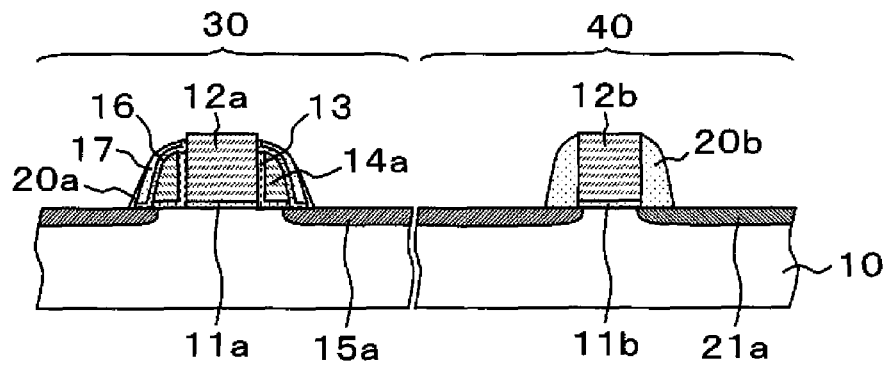
FIG. 6B  (FIRST EXEMPLARY EMBODIMENT)
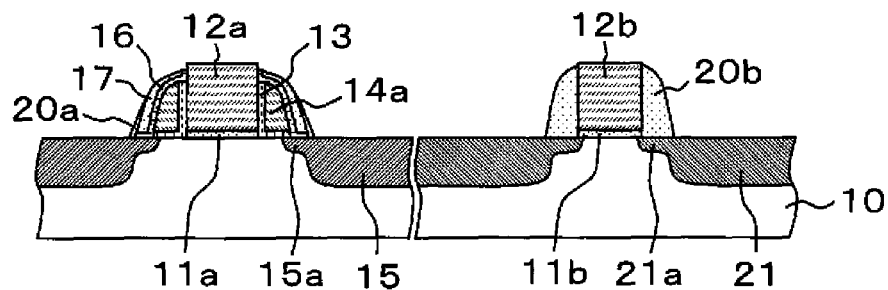
FIG. 6C  (FIRST EXEMPLARY EMBODIMENT)
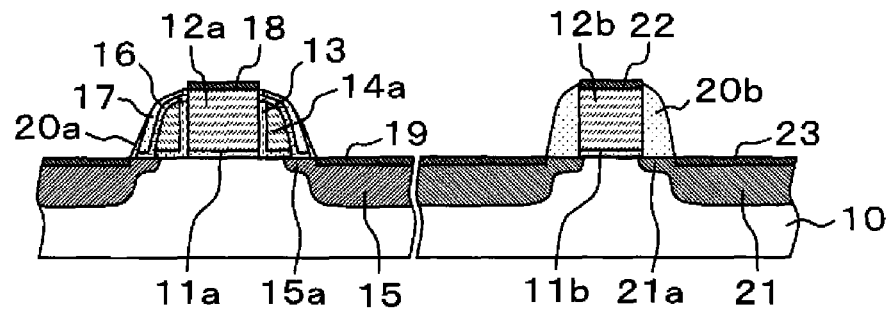

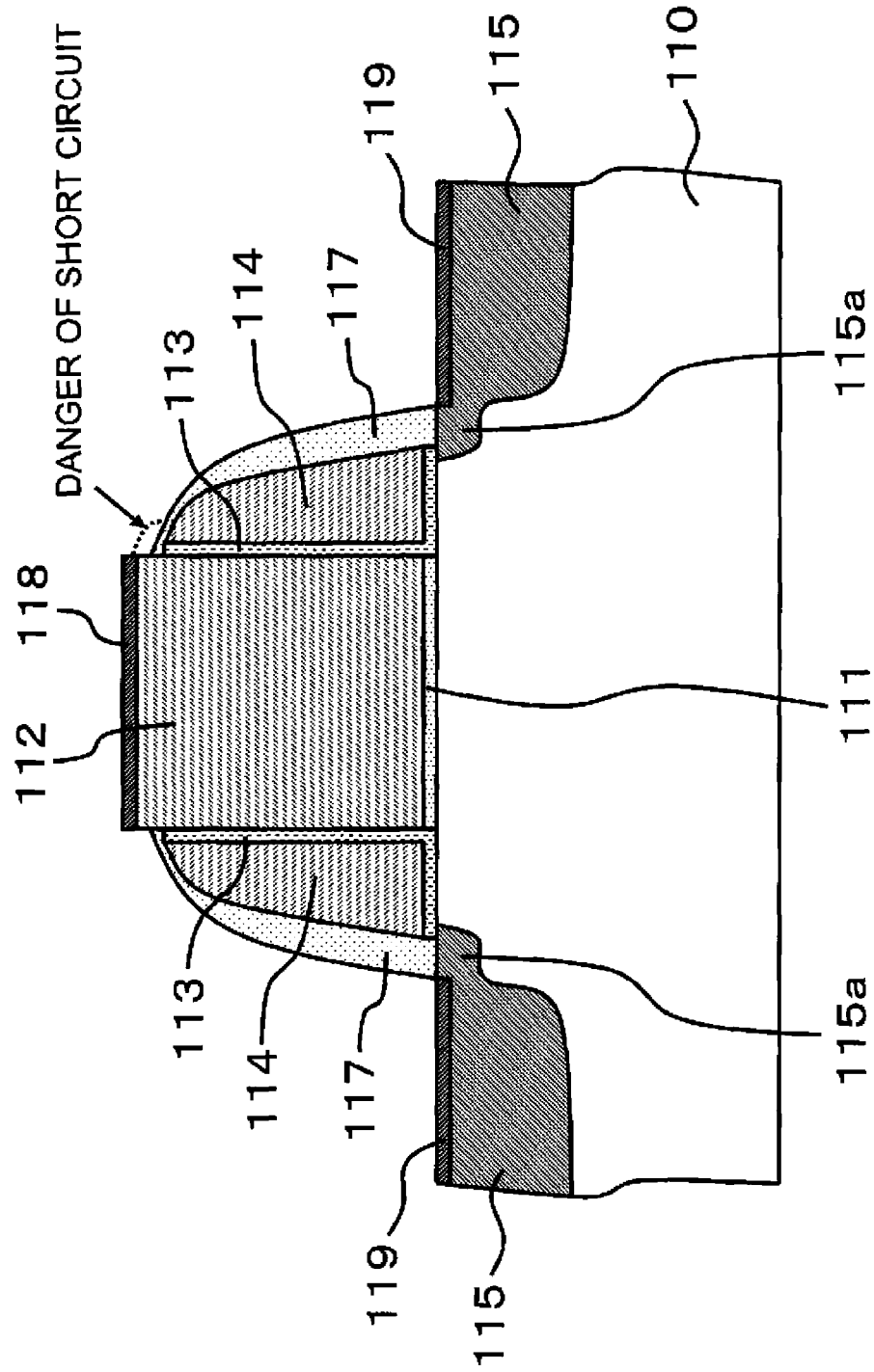
FIG. 7 (FIRST EXAMPLE OF RELATED ART)

ved by the present invention.

SEMICONDUCTOR DEVICE

REFERENCE TO RELATED APPLICATION

This application is based upon and claims the benefit of the priority of Japanese patent application No. 2008-319701 filed on Dec. 16, 2008, the disclosure of which is incorporated herein in its entirety by reference thereto.

TECHNICAL FIELD

This invention relates to a semiconductor device and, more particularly, to a semiconductor device having a non-volatile memory.

BACKGROUND

As illustrated in FIG. 7, a conventional semiconductor device having a non-volatile memory includes a memory cell in which a pair of impurity regions 115 are formed embracing a channel region on the main surface of a semiconductor substrate 110, a selection gate electrode 112 is formed on the channel region via a gate insulating film 111, and sidewall-shaped control gate electrodes 114 are formed via gate isolation insulating films 113 (e.g., ONO film) on both side surfaces of the selection gate electrode 112 and on the surface of the channel region (the channel region in the area between each of the impurity regions 115 and the selection gate electrode 112). Silicon oxide file 117 is further formed on the control gate 114 as a protective insulating film. When the cell is selected by supplying the selection gate electrode 112 with a prescribed potential in such a semiconductor memory device, controlling the potential supplied to each of the impurity regions 115 and to each of the control gate electrodes 114 makes it possible to write in data by causing electric charge to accumulate in the gate isolation insulating film 113 beneath the control gate electrodes 114, to read out the data and to erase the data by dispelling the electric charge from the gate isolation insulating film 113.

In an impurity region connected to a gate line in a semiconductor device having such a non-volatile memory, there are cases where a portion connected to a contact plug is silicided in order to lower the resistance value. When an impurity region is silicided, there are instances where a short circuit develops between a control gate electrode and the impurity region if a coating comprising a protective insulating film that protects the control gate electrode is inadequate. As an example of a technique for preventing such short-circuiting of the control gate electrode (control gate) and impurity region (impurity diffusion layer) ascribable to silicidation, Patent Document 1 discloses using an SiON film 213, which is resistant to "light" etching (wet etching employing a hydrofluoric acid solution) as the protective insulating film (sidewall protecting film) for covering the control gate electrode (control gate CG) (see FIG. 8).

[Patent Document 1] Japanese Patent Kokai Publication No. JP-P2004-247521A

SUMMARY

The entire disclosure of Patent Document 1 is incorporated herein by reference thereto. The following analysis is given by the present invention.

However, with a protective insulating film (sidewall protecting film) comprising a single layer of SiON film 213, there is the danger that the margin (short-circuit margin) between the control gate electrode (control gate CG) and a silicide film 215 will not be obtained owing to variations in etching. Further, even though the SiON film 213 is capable of resisting "light" etching (wet etching employing a hydrofluoric acid solution), the surface does deteriorate. As a consequence, there is the danger that the SiON film 213 may peel off and result in a short circuit.

In the case also of a selection gate electrode connected to a word line, there are cases where a portion connected to a contact plug is silicided in order to lower the resistance value in a manner similar to the case of the impurity region. In a case where variations in the inner surface at the time of gate electrode formation gives rise to a location where the distance between the upper portion of the selection gate electrode and the upper portion of the control gate electrode is short, there are instances where a portion not covered by the protective insulating film occurs in the vicinity of the upper portion of the control gate electrode. If the selection gate electrode 112 is silicided in a state in which there is no covering of the control gate electrode 114 by the protective insulating film, the silicided portion of the selection gate electrode 112 (a silicide layer 118) may overhang, the upper portion of the control gate electrode 114 may be silicided and the control gate electrode 114 and selection gate electrode 112 may be short-circuited (see FIG. 7).

In order to suppress the short-circuiting of the control gate electrode and selection gate electrode, enlarging the distance between the upper portion of the selection gate electrode and the upper portion of the control gate electrode is conceivable. Conceivable means of enlarging this distance include (1) raising the height of the selection gate electrode and (2) lowering height of the control gate electrode.

Raising the height of the selection gate electrode involves raising the height of the gate electrode of the peripheral circuit region at the same time. Such microfine processing is difficult. In other words, in a case where the selection gate electrode of the memory cell region is formed of the same material as that of the gate electrode of the peripheral circuit region, the process will be complicated, cost will rise and yield will be inadequate if separate forms of fabrication are used in order to control the respective film thicknesses. Further, if the gate electrode of the peripheral circuit region is formed after the memory element is formed in the memory cell region, there is the danger that sidewall-shaped polysilicon will remain on the sidewall of the memory element in the memory cell region. On the other hand, if the control gate electrode is lowered, the cross-section area of the control gate electrode will decline and this will lead to an increase in the resistance of the control gate electrode. Owing to the problems set forth above, there is no advantage in enlarging the distance between the upper portion of the selection gate electrode and the upper portion of the control gate electrode. Thus there is much to be desired in the art.

The present invention primarily seeks to provide a semiconductor device in which a short-circuit failure between a selection gate electrode and a control gate electrode can be suppressed while the distance between the upper portion of the selection gate electrode and the upper portion of the control gate electrode is shortened.

According to a first aspect of the present invention, there is provided a semiconductor device comprising: an impurity region formed on both sides of a channel region of a semiconductor substrate; a selection gate electrode formed on the channel region via a gate insulating film; a control gate electrode formed in a sidewall shape via a gate isolation insulating film on both side surfaces of the selection gate electrode and on the surface of the channel region; a protective insulating film covering the sidewall of the control gate electrode; and a silicide layer formed on the selection gate electrode. The protective insulating film has a two-layer structure formed of a silicon nitride film covering the sidewall of the control gate electrode and a silicon oxide film covering the silicon nitride film.

The meritorious effects of the present invention are summarized as follows.

In accordance with the present invention, the control gate electrode is covered by the silicon nitride film and the silicon nitride film is covered by the silicon oxide film. As a result, a short-circuit failure between the selection gate electrode and the control gate electrode can be suppressed while the distance between the upper portion of the selection gate electrode and the upper portion of the control gate electrode is shortened. Even if the silicide layer formed on the upper portion of the selection gate electrode overhangs, the control gate electrode is covered by the silicon nitride film and silicon oxide film and, therefore, it can be so arranged that a short circuit will not develop between the selection gate electrode and the control gate electrode.

Other features and advantages of the present invention will be apparent from the following description taken in conjunction with the accompanying drawings, in which like reference characters designate the same or similar parts throughout the figures thereof.

BRIEF DESCRIPTIONS OF THE DRAWINGS

FIG. 1 is a partial sectional view schematically illustrating the structure of a memory cell in a semiconductor device according to a first exemplary embodiment of the present invention;

FIG. 2 is an enlarged partial sectional view schematically illustrating the structure of the memory cell in the vicinity of the upper portion of a control gate electrode in the semiconductor device according to the first exemplary embodiment of the present invention;

FIGS. 3A to 3D are first-process sectional views schematically illustrating a method of manufacturing a semiconductor device according to the first exemplary embodiment of the present invention;

FIGS. 4A to 4C are second-process sectional views schematically illustrating a method of manufacturing a semiconductor device according to the first exemplary embodiment of the present invention;

FIGS. 5A to 5C are third-process sectional views schematically illustrating a method of manufacturing a semiconductor device according to the first exemplary embodiment of the present invention;

FIGS. 6A to 6C are fourth-process sectional views schematically illustrating a method of manufacturing a semiconductor device according to the first exemplary embodiment of the present invention;

FIG. 7 is a partial sectional view schematically illustrating the structure of a memory cell in a semiconductor device according to a first example of the related art.

PREFERRED MODES

Figure 8:
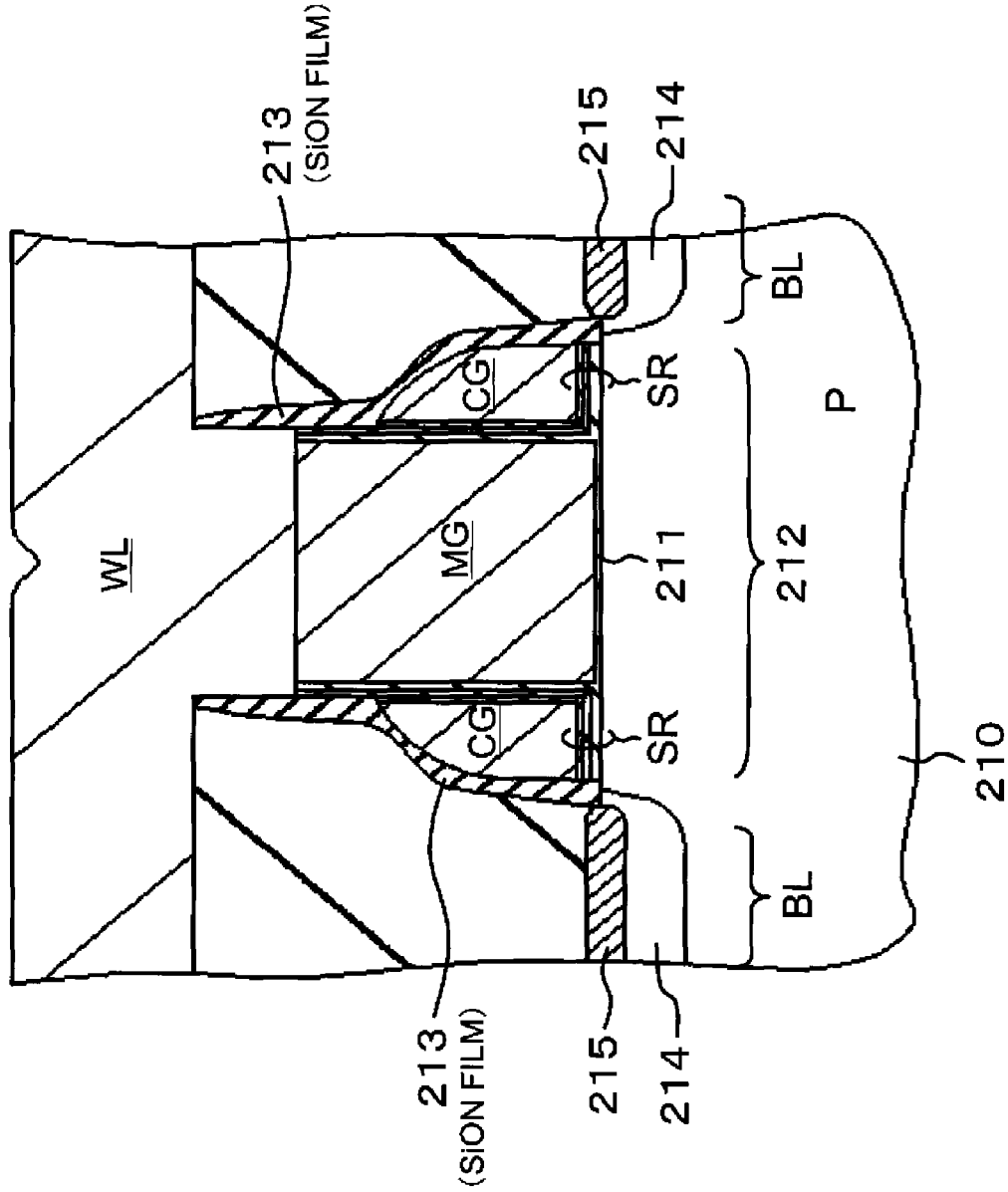
FIG. 8 is a partial sectional view schematically illustrating the structure of a memory cell in a semiconductor device according to a second example of the related art (prior art).

A semiconductor device according to an exemplary embodiment of the present invention comprises an impurity region 15 (FIG. 1) formed on both sides of a channel region of a semiconductor substrate 10 (FIG. 1); a selection gate electrode 12a (FIG. 1) formed on the channel region via a gate insulating film 11a (FIG. 1); a control gate electrode 14a (FIG. 1) formed in a sidewall shape via a gate isolation insulating film 13 (FIG. 1) on both side surfaces of the selection gate electrode 12a (FIG. 1) and on the surface of the channel region; a protective insulating film (16, 17 in FIG. 1) covering the sidewall of the control gate electrode 14a (FIG. 1); and a silicide layer 18 (FIG. 1) formed on the selection gate electrode 12a (FIG. 1). The protective insulating film (16, 17 in FIG. 1) is a two-layer structure consisting of a silicon nitride film 16 (FIG. 1) covering the sidewall of the control gate electrode 14a (FIG. 1) and a silicon oxide film 17 (FIG. 1) covering the silicon nitride film 16 (FIG. 1).

Reference will be had to the drawings to describe a semiconductor device according to a first exemplary embodiment of the present invention. FIG. 1 is a partial sectional view schematically illustrating the structure of a memory cell in a semiconductor device according to the first exemplary embodiment, and FIG. 2 is an enlarged partial sectional view schematically illustrating the structure of the memory cell in the vicinity of the upper portion of a control gate electrode in the semiconductor device according to the first exemplary embodiment.

This semiconductor device is a semiconductor memory device having a non-volatile memory. In a memory cell of the semiconductor device, a pair of impurity regions 15 are formed embracing a channel region on the main surface of a semiconductor substrate 10, a selection gate electrode 12a is formed on the channel region via a gate insulating film (e.g., a silicon oxide film) 11a, and sidewall-shaped control gate electrodes 14a are formed via gate isolation insulating films 13 (e.g., ONO film capable of accumulating electric charge) on both side surfaces of the selection gate electrode 12a and on the surface of the channel region (the channel region in the area between each of the impurity regions 15 and the selection gate electrode 12a. An LDD (Lightly Doped Drain) region 15a formed to be shallower than the impurity region 15 is formed in the portion of the impurity region 15 that is on the side of the channel region.

A MOS structure is adopted for the region of the selection gate electrode 12a, and an MONOS structure is adopted for the region of the control gate electrode 14a.

The control gate electrode 14a is covered by a silicon nitride film 16, and a sidewall-shaped silicon oxide film 17 is formed on the silicon nitride film 16. The silicon nitride film 16 and the silicon oxide film 17 constitute a protective insulating film of the control gate electrode 14a. The protective insulating film may have such a structure that a second silicon oxide film is interposed between the sidewall of the control gate electrode 14a and the silicon nitride film 16. A sidewall-shaped silicon oxide film 20a formed attendant upon the formation of the sidewall of the gate electrode of a peripheral circuit (not shown) is formed on the sidewall of the silicon oxide film 17. A silicide layer 18 is formed on the surface of the selection gate electrode 12a. A silicide layer 19 is formed in an area on the surface of the impurity region 15 that is not covered by the silicon nitride film 16 and silicon oxide films 17, 20a.

The semiconductor substrate 10 is a silicon substrate whose conductivity type is opposite that of the impurity region 15.

The gate insulating film 11a is an insulating film such as a silicon oxide film.

The selection gate electrode 12a is an electrode for gate selection and comprises polysilicon or the like. The selection gate electrode 12a is electrically connected to the word line driver (not shown) of a peripheral circuit (not shown) through a via (not shown) and word line (not shown).

The gate isolation insulating film 13 is an insulating film which, in comparison with the gate insulating film 11a, has a charge accumulating capability. An ONO film, for example, can be used as the gate isolation insulating film 13. The film thickness of the gate isolation insulating film 13 can be made, for instance, 15 nm (150 Å) if the film is ONO film.

The control gate electrodes 14a are electrodes for a control gate and may comprise polysilicon or the like. One of the control gate electrodes 14a is electrically connected to ground (ground wiring) through a via (not shown) and wiring (not shown). The other control gate electrode 14a is electrically connected to the control gate driver (not shown) of a peripheral circuit (not shown) through a via (not shown) and wiring (not shown). The sidewall surface of the control gate electrode 14a is covered by the silicon nitride film 16, which has an etching rate different from that of silicon oxide film, and the silicon nitride film 16 is covered by the silicon oxide film 17. By covering the control gate electrode 14a by the two-layer-structure protective insulating film formed of the silicon nitride film 16 and silicon oxide film 17, a short circuit between the control gate electrode 14a and selection gate electrode 12a is suppressed and the difference in height between the control gate electrode 14a and selection gate electrode 12a can be made about one-tenth, or so, the height of the selection gate electrode 12a.

The impurity regions 15 are source-drain regions obtained by injecting an impurity whose conductivity type is opposite that of the semiconductor substrate 10 into the semiconductor substrate 10. One of the impurity regions 15 is electrically connected to the bit line driver (not shown) of a peripheral circuit (not shown) through the silicide layer 19, a via (not shown) and a bit line (not shown). The other impurity region 15 is electrically connected to ground (ground wiring) through a via (not shown) and a common source line (not shown). The LDD region 15a is formed in a portion of the impurity region 15 on the side of the channel region. The LDD region 15a, which is a region obtained by injecting an impurity identical with that of the impurity region 15, is formed to be shallower than the impurity region 15 and connects to the impurity region 15. The LDD region 15a is formed beneath the silicon nitride film 16 and silicon oxide film 17.

The silicon nitride film 16 is a protective insulating film covering the control gate electrode 14a. The silicon nitride film 16 is covered by the silicon oxide film 17. The film thickness of the silicon nitride film 16 preferably is 10 nm (100 Å) or greater, for instance. The reason is that if the film thickness is less than 10 nm, there is the danger that a short circuit will develop between the selection gate electrode 12a and the control gate electrode 14a. In other words, if the film thickness of the silicon nitride film 16 is less than 10 nm, there is the danger that owing to etch-back (dry etching) of the silicon oxide film 17 and wet etching (removal of native oxide film produced on the surface of the selection gate electrode 12a) by hydrofluoric acid performed by pre-treatment at formation of the silicide layer 18 on the selection gate electrode 12a, the silicon nitride film 16 will partially vanish, the surface of the control gate electrode 14a will become exposed and a short circuit will develop between the selection gate electrode 12a and control gate electrode 14a by silicidation of the surface of the selection gate electrode 12a. In view of these facts, the total thickness of the silicon nitride film 16 and silicon oxide film 17 preferably is made less than the difference in height between the selection gate electrode 12a and control gate electrode 14a. Further, the film thickness of the silicon nitride film 16 preferably is made less than half the difference in height between the selection gate electrode 12a and control gate electrode 14a and less than the film thickness of the silicon oxide film 17.

The silicon oxide film 17 is a protective insulating film for covering the control gate electrode 14a via the silicon nitride film 16. By way of example, TEOS-NSG (Tetra-Ethyl-Ortho-Silicate Non-Doped Silicate Glass) can be used as the silicon oxide film 17. The silicon oxide film 17 is a protective film that prevents the silicon nitride film 16 from being damaged by dry etching and prevents the silicon nitride film 16 from peeling off owing to dry etching in post-treatment. The silicon oxide film 17 serves as an etching buffer material. In view of these facts, at a location where its film thickness is smallest, the silicon oxide film 17 preferably has a thickness equal to or greater than half the difference in height between the selection gate electrode 12a and control gate electrode 14a.

The silicide layer 18 is a layer obtained by silicidizing the upper portion of the selection gate electrode 12a and is a portion that connects to a contact plug (not shown). The silicide layer 19 is a layer obtained by silicidizing the area on the impurity region 15 that is adjacent to the silicon oxide 20a. The silicide layer 19 is a portion that connects to a contact plug (not shown).

Next, a method of manufacturing the semiconductor device according to the first exemplary embodiment of the present invention will be described with reference to the drawings, in which FIGS. 3A to 3D, FIGS. 4A to 4C, FIGS. 5A to 5C and FIGS. 6A to 6C are process sectional views schematically illustrating a method of manufacturing a semiconductor device according to the first exemplary embodiment.

First, a silicon oxide film 11 that will serve as gate insulating films (11a, 11b in FIGS. 6A to 6C) is formed on a semiconductor substrate 10 and a silicon layer 12 that will serve as a selection gate electrode (12a in FIGS. 6A to 6C) and gate electrode (12b in FIGS. 6A to 6C) is formed on the silicon oxide film 11 (step A1; see FIG. 3A). It should be noted that the silicon oxide film 11 and silicon layer 12 are formed also on a peripheral circuit area 40 at step A1.

Next, a resist (not shown) for covering a portion left as the selection gate electrode (12a in FIGS. 6A to 6C) is formed on the silicon layer 12, after which the silicon layer 12 and silicon oxide film 11 are etched using the resist as a mask, whereby the gate insulating film 11a and selection gate electrode 12a are formed on the channel region of the semiconductor substrate 10 (step A2; see FIG. 3B). The resist is subsequently removed. It should be noted that the peripheral circuit area 40 is not worked at step A2.

Next, the gate isolation insulating film 13 is formed on the surface of the substrate 10 that includes the selection gate electrode 12a and silicon layer 12 (step A3; see FIG. 3C). It should be noted that the gate isolation insulating film 13 is formed also on the peripheral circuit area 40 at step A3.

Next, a silicon layer 14 for the control gate electrode (14a in FIGS. 6A to 6C) is formed on the surface of the gate isolation insulating film 13 (step A4; see FIG. 3D). Since the film thickness of the silicon layer 14 decides the gate length of the control gate electrode (14a in FIGS. 6A to 6C) and the gate length is dependent upon write and erase speed, it is so arranged that the film thickness of the silicon layer 14 for the gate control electrode will not become too large. It should be noted that the silicon layer 14 is formed also on the peripheral circuit area 40 at step A4.

Next, the sidewall-shaped control gate electrode 14a is formed by subjecting the silicon layer (14 in FIG. 3D) to etch-back (anisotropic etching), then the exposed gate isolation insulating film 13 is subjected to etching (anisotropic dry etching), and then the portions of the gate isolation insulating film 14a formed on both ends of the selection gate electrode 12a in the longitudinal direction are removed (by polycut etching) (step A5; see FIG. 4A). At this time the control gate electrode 14a becomes lower in height than the selection gate electrode 12a. It should be noted that the silicon layer (14 in FIG. 3D) and gate isolation insulating film (13 in FIG. 3D) are removed in the peripheral circuit area 40 at step S14.

Next, the surfaces of the selection gate electrode 12a, control gate electrode 14a and silicon layer 12 are oxidized and then an impurity is injected into the semiconductor substrate 10, whereby a pair of LDD regions 15a are formed in self-aligning fashion on both sides of the channel region of semiconductor substrate 10 (step A6; see FIG. 4B). A second silicon oxide film (not shown) is formed by the surface oxidation of the selection gate electrode 12a, control gate electrode 14a and silicon layer 12. The second silicon oxide film is on the order of about 5 nm (50 Å) and serves as a buffer when the silicon nitride film 16 is formed at step A7. It should be noted that the peripheral circuit area 40 is not worked at step A6.

Next, the silicon nitride film 16 is formed on the substrate that includes the selection gate electrode 12a, control gate electrode 14a, silicon layer 12 and LDD region 15a and then the silicon oxide film 17 is formed on the silicon nitride film 16 (step A7; see FIG. 4C). It should be noted that the silicon nitride film 16 and silicon oxide film 17 are formed also in the peripheral circuit area 40.

Next, the silicon oxide film 17 is formed in the shape of a sidewall on the sidewall of the control gate electrode 14a by subjecting the silicon oxide film 17 to etch-back (anisotropic etching) and then the exposed silicon nitride film 16 is etched away (step A8; see FIG. 5B). It should be noted that the silicon nitride film 16 and silicon oxide film 17 are removed in the peripheral circuit area 40 at step A8.

The peripheral circuit area 40 is worked following step A8.

With regard to the working of the peripheral circuit area 40, first the entirety of memory cell area 30 is covered and a resist (not shown) for covering a portion left as the gate electrode 12b is formed on the silicon layer 12 (12 in FIG. 5A) of the peripheral circuit area 40, after which the silicon layer (12 in FIG. 5A) and silicon oxide film (11 in FIG. 5A) are etched using the resist as a mask, whereby the gate insulating film 11b and gate electrode 12b are formed on the channel region of the semiconductor substrate 10 (step A9; see FIG. 5B). This is followed by removing the resist.

Next, a resist (not shown) for covering the entire memory cell area 30 is formed, then the surface of the gate electrode 12b is oxidized and then an impurity is injected into the semiconductor substrate 10 of the peripheral circuit area 40, whereby a pair of LDD regions 21a are formed in self-aligning fashion on both sides of the channel region of semiconductor substrate 10 in the peripheral circuit area 40 (step A10; see FIG. 5C). This is followed by removing the resist.

Next, a silicon oxide film is formed on the substrate that includes the memory cell area 30 and peripheral circuit area 40 and then the silicon oxide film is subjected to etch-back (anisotropic etching) to thereby form sidewall-shaped silicon oxide film 20b on the sidewall of the gate electrode 12b (step A11; see FIG. 6A). At this time the sidewall-shaped silicon oxide film 20a is formed also on the sidewall of the sidewall-shaped silicon oxide film 17.

Next, a resist having openings is formed on the substrate in an area that will become impurity regions 15, 21 and an impurity is injected into the semiconductor substrate 10 using this resist as a mask, thereby forming a pair of impurity regions 15 in self-aligning fashion on both sides of the channel region of semiconductor substrate 10 in the memory cell area 30 and forming a pair of impurity regions 21 in self-aligning fashion on both sides of the channel region of semiconductor substrate 10 in the peripheral circuit area 40 (step A12; see FIG. 6B). This is followed by performing activation annealing for activating the impurity regions 15 and 21.

Next, the substrate is immersed in a (mild) hydrofluoric acid solution and washed (step A13). A native oxide film that has been formed on the portion to undergo silicidation is removed at this time.

Next, a metal (e.g., Co) for the purpose of silicidation is sputter-deposited and silicide layers 18, 19, 22, 23 are formed subsequently by a thermal treatment (step A14; see FIG. 6C).

This is followed by forming interlayer insulating films, vias and wiring in suitable fashion in a manner similar to that of the conventional art, thereby completing the semiconductor device.

In accordance with the first exemplary embodiment, the control gate electrode 14a is covered by the silicon nitride film 16 and the silicon nitride film 16 is covered by the silicon oxide film 17, thereby making it possible to suppress a short-circuit failure between the selection gate electrode 12a and control gate electrode 14a while shortening the distance between the upper portion of the selection gate electrode 12a and the upper portion of the control gate electrode 14a. Even if the silicide layer 18 formed on the upper portion of the selection gate electrode 12a overhangs, the control gate electrode 14a is covered by the silicon nitride film 16 and silicon oxide film 17 and therefore it can be so arranged that a short circuit will not develop between the selection gate electrode 12a and the control gate electrode 14a. By adopting the silicon nitride film 16 as the lower layer and the silicon oxide film 17 as the upper layer of the insulating film covering the sidewall of the control gate electrode 14a, the silicon nitride film 16 is prevented from being peeled off by dry etching and wet etching. In addition, while the adhesion between the silicon nitride film 16 and control gate electrode 14a is improved, the silicon nitride film 16 per se becomes an insulating film and, theoretically, short-circuit failure can be completely eliminated.

Further, yield of the semiconductor device can be improved owing to suppression of short-circuit failure between the selection gate electrode 12a and control gate electrode 14a.

Since a greater degree of freedom is provided for the height of the control gate electrode 14a, the difference in height between the selection gate electrode 12a and control gate electrode 14a can be reduced and the control gate electrode 14a can be enlarged. As a result, the resistance value of the control gate electrode 14a declines and high-speed operation of the semiconductor device becomes possible.

Furthermore, the silicon oxide film 20a is formed on the sidewall of the silicon oxide film 17, which becomes the sidewall of the control gate electrode 14a in the memory cell area 30, when the silicon oxide film 20b, which becomes the sidewall of the gate electrode 12b in the peripheral circuit area 40, is formed. As a result, a margin (short-circuit margin) between the control gate electrode 14a and silicide layer 19 is assured and a short circuit between the control gate electrode 14a and silicide layer 19 can be eliminated.

Although a semiconductor memory device has been described as an example of a semiconductor device in the first exemplary embodiment, the present invention is applicable not only to a semiconductor memory device but also to a semiconductor device having a transistor of the type in which a trench is formed in a control gate electrode portion and wiring is embedded therein.

In the present invention, there are various possible modes, which include followings.

Mode 1: A semiconductor device as mentioned as the first aspect.

Mode 2: The semiconductor device according to Mode 1, wherein the silicon oxide film may comprise TEOS-NSG.

Mode 3: The semiconductor device according to Mode 1, wherein the silicon nitride film may have a film thickness less than half a difference in height between the selection gate electrode and the control gate electrode.

Mode 4: The semiconductor device according to Mode 3, wherein the silicon nitride film may have a film thickness of 10 nm or greater.

Mode 5: The semiconductor device according to any one of Modes 1 to 4, wherein the silicon nitride film may have a film thickness equal to or greater than half a difference in height between the selection gate electrode and the control gate electrode at a location where its film thickness is smallest.

Mode 6: The semiconductor device according to Mode 5, wherein the silicon oxide film may have a film thickness of 10 nm or greater at a location where its film thickness is smallest.

Mode 7: The semiconductor device according to any one of Modes 1 to 6, wherein the silicon nitride film and silicon oxide film may have a total thickness less than a difference in height between the selection gate electrode and the control gate electrode.

Mode 8: The semiconductor device according to any one of Modes 1 to 7, may further comprise: a second silicon oxide film covering at least a portion of a sidewall of the silicon oxide film; and a second silicide layer formed in an area on the impurity region that is adjacent to the second silicon oxide film.

Mode 9: The semiconductor device according to any one of Modes 1 to 8, wherein the protective insulating film may have a second silicon oxide film interposed between the sidewall of the control gate electrode and the silicon nitride film As many apparently widely different embodiments of the present invention can be made without departing from the spirit and scope thereof, it is to be understood that the invention is not limited to the specific exemplary embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A semiconductor device, comprising:
    an impurity region formed on both sides of a channel region of a semiconductor substrate;
    a selection gate electrode formed on the channel region via a gate insulating film;
    a control gate electrode formed in a sidewall shape via a gate isolation insulating film formed on less than an entirety on both side surfaces of said selection gate electrode and on the surface of the channel region;
    a protective insulating film covering the sidewall of said control gate electrode and a remaining portion of the entirety of both the side surfaces of said selection gate electrode; and
    a silicide layer formed on said selection gate electrode,
    wherein the protective insulating film comprises a two-layer structure formed of a silicon nitride film covering the sidewall of said control gate electrode and a silicon oxide film covering the silicon nitride film, and said control gate electrode is disposed between said gate isolation insulating film and said protective insulating film.

2. The semiconductor device according to claim 1, wherein said silicon oxide film comprises TEOS-NSG.

3. The semiconductor device according to claim 1, wherein the silicon nitride film has a film thickness less than half a difference in height between said selection gate electrode and said control gate electrode.

4. The semiconductor device according to claim 3, wherein the silicon nitride film has a film thickness of 10 nm or greater.

5. The semiconductor device according to claim 1, wherein the silicon nitride film has a film thickness equal to or greater than half a difference in height between said selection gate electrode and said control gate electrode at a location where its film thickness is smallest.

6. The semiconductor device according to claim 5, wherein the silicon oxide film has a film thickness of 10 nm or greater at a location where its film thickness is smallest.

7. The semiconductor device according to claim 1, wherein the silicon nitride film and silicon oxide film have a total thickness less than a difference in height between said selection gate electrode and said control gate electrode.

8. The semiconductor device according to claim 1, further comprising:
    a second silicon oxide film covering at least a portion of a sidewall of the silicon oxide film; and
    a second silicide layer formed in an area on said impurity region that is adjacent to said second silicon oxide film.

9. The semiconductor device according to claim 1, wherein said protective insulating film has a second silicon oxide film interposed between the sidewall of said control gate electrode and the silicon nitride film.

* * * * *